(12) United States Patent
Chen et al.

(10) Patent No.: US 12,249,592 B2
(45) Date of Patent: Mar. 11, 2025

(54) DYNAMIC BONDING GAP CONTROL AND TOOL FOR WAFER BONDING

(71) Applicant: Taiwan Semiconductor Manufacturing Co., Ltd., Hsinchu (TW)

(72) Inventors: Han-De Chen, Hsinchu (TW); Cheng-I Chu, Taipei (TW); Yun Chen Teng, New Taipei (TW); Chen-Fong Tsai, Hsinchu (TW); Jyh-Cherng Sheu, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 393 days.

(21) Appl. No.: 17/648,236

(22) Filed: Jan. 18, 2022

(65) Prior Publication Data

US 2023/0019415 A1 Jan. 19, 2023

Related U.S. Application Data

(60) Provisional application No. 63/219,915, filed on Jul. 9, 2021.

(51) Int. Cl.
*H01L 21/00* (2006.01)
*H01L 21/66* (2006.01)
*H01L 23/00* (2006.01)

(52) U.S. Cl.
CPC .............. *H01L 24/94* (2013.01); *H01L 22/12* (2013.01); *H01L 24/741* (2013.01)

(58) Field of Classification Search
CPC ....... H01L 24/94; H01L 22/12; H01L 24/741; H01L 21/67259; H01L 21/681; H01L 21/6838; H01L 21/67092; H01L 21/187
See application file for complete search history.

(56) References Cited

U.S. PATENT DOCUMENTS

| | | | | |
|---|---|---|---|---|
| 7,682,933 B1 * | 3/2010 | Loomis | .................... | H01L 25/50 438/455 |
| 9,646,860 B2 * | 5/2017 | Huang | .............. | H01L 21/67092 |
| 10,109,487 B2 * | 10/2018 | Kurz | .................. | H01L 21/67092 |
| 10,410,892 B2 * | 9/2019 | Lu | ........................... | H01L 24/80 |
| 11,056,356 B1 * | 7/2021 | Mueller | .................. | C03C 27/06 |

* cited by examiner

*Primary Examiner* — Nicholas J Tobergte
(74) *Attorney, Agent, or Firm* — Slater Matsil, LLP

(57) ABSTRACT

A method includes placing a first wafer on a first wafer stage, placing a second wafer on a second wafer stage, and pushing a center portion of the first wafer to contact the second wafer. A bonding wave propagates from the center portion to edge portions of the first wafer and the second wafer. When the bonding wave propagates from the center portion to the edge portions of the first wafer and the second wafer, a stage gap between the top wafer stage and the bottom wafer stage is reduced.

20 Claims, 17 Drawing Sheets

DYNAMIC BONDING GAP CONTROL AND TOOL FOR WAFER BONDING

PRIORITY CLAIM AND CROSS-REFERENCE

This application claims the benefit of the following provisionally filed U.S. patent application: Application No. 63/219,915, filed on Jul. 9, 2021, and entitled "Dynamic Bonding Gap Control and Tool Design to Further Reduce Wafer Overlay Residuals," which application is hereby incorporated herein by reference.

BACKGROUND

Wafer-to-wafer bonding is used for bonding integrated circuits and to form three-dimensional circuits. In a wafer-to-wafer bonding process, two wafers may be pre-bonded through a pre-bonding process, and then an annealing process is preformed to permanently bond the two wafers together.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
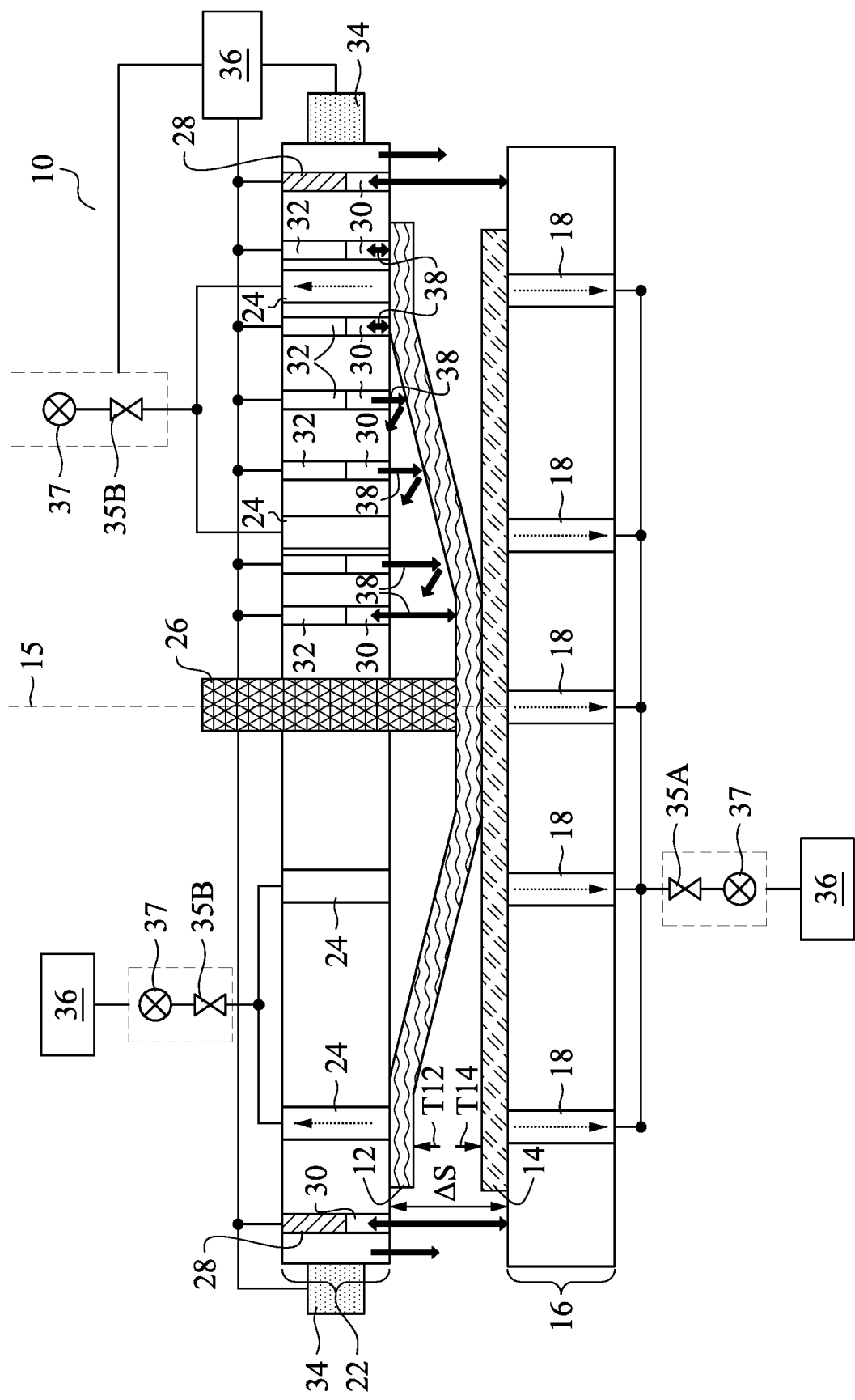
FIG. 1 illustrates a cross-sectional view of a wafer-bonding module in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer bonding process adopting dynamic bond gap control and the production tool for achieving the dynamic bond gap control are provided. In accordance with some embodiments of the present disclosure, a first wafer on a first wafer stage is pre-bonded to a second wafer on a second wafer stage by pushing a center of the first wafer toward the second wafer to initiate a bonding wave. The bonding wave is propagated from the wafer center to edges of the first wafer and the second wafer. During the propagation of the bonding wave, the stage gap between the first wafer stage and the second wafer stage is dynamically controlled, and is reduced according to the propagation of the bonding wave. As a result, the radius of curvature of the bent portions of the first wafer is reduced, and the stress residue in the resulting bonded wafers is also reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 2:
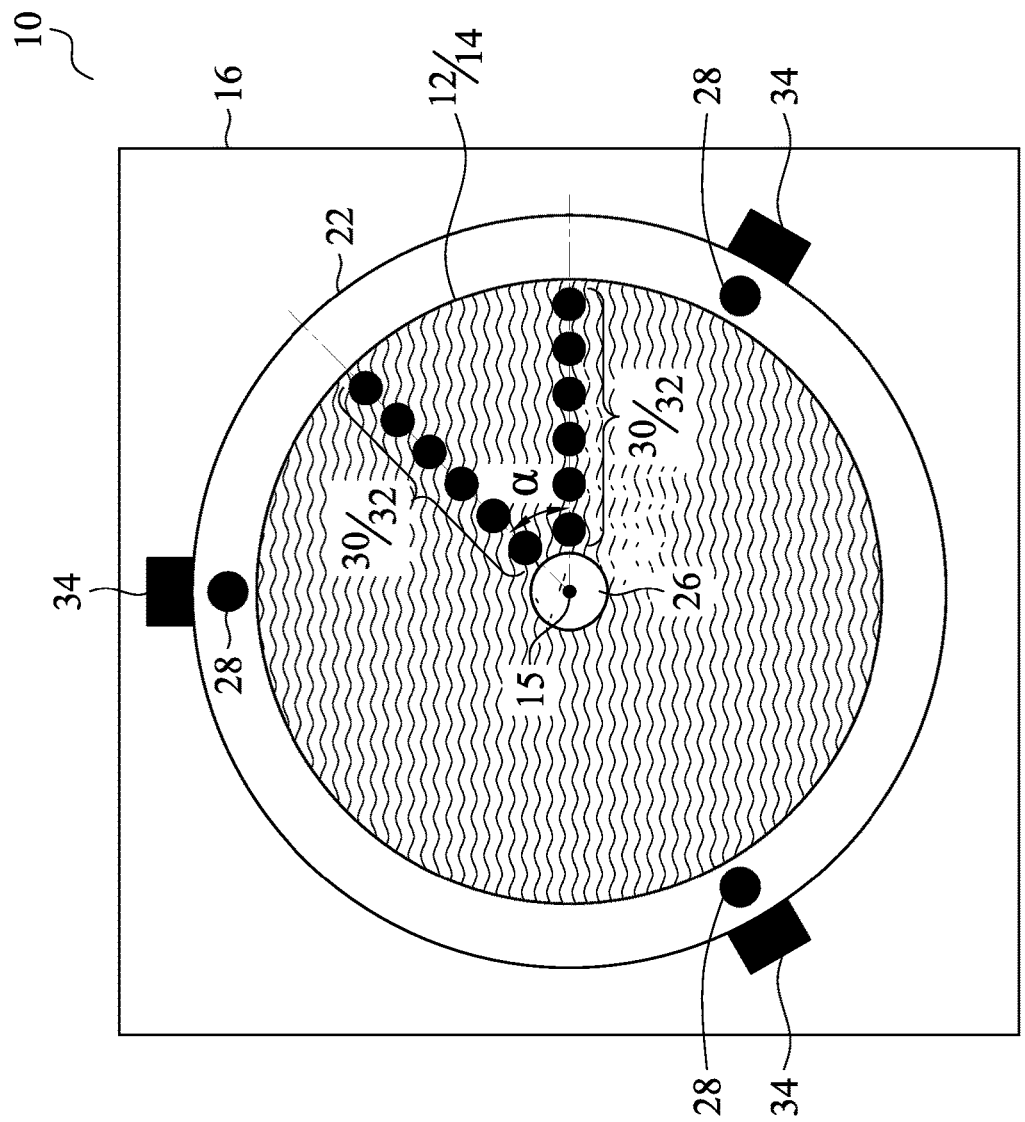
FIG. 2 illustrates a top view of a wafer-bonding module in accordance with some embodiments.

FIGS. 1 and 2 illustrate a cross-sectional view and a top view, respectively, of a wafer bonding module 10, which is configured to bond a first wafer 12 (also referred to as a top wafer) with a second wafer 14 (also referred to as a bottom wafer). In FIG. 1, top wafer 12 is shown as being deformed, which is caused by pushing top wafer 12 using center pin 26. The illustrated deformation may be exaggerated, while the actual deformation is smaller than illustrated. Each of top wafer 12 and bottom wafer 14 may be an oxide wafer, a bare silicon wafer, a GaN wafer, a hybrid bonding wafer, a hydrophilic bonding wafer, a hydrophobic bonding wafer, or the like, in any combination. The surface of each of wafer 12 and wafer 14 may include a silicon-containing dielectric material such as silicon oxide, silicon nitride, silicon carbide, silicon oxynitride, silicon oxycarbide, or the like. The surface of each of wafer 12 and wafer 14 may also include a semiconductor material such as silicon or a dielectric material including a silicon compound. Wafers 12 and 14 may be activated, for example, treated using plasma generated from gases including hydrogen ($H_2$), oxygen ($O_2$), nitrogen ($N_2$), and argon, for example, so that SiOH bonds may be formed on their surfaces.

As shown in FIG. 1, bonding module 10 includes a bottom wafer stage 16, and vacuum channels 18 in bottom wafer stage 16. The vacuum channels 18, with vacuum being generated therein, are used for sucking and fixing the overlying bottom wafer 14 on bottom wafer stage 16. The vacuum may be generated by one or a plurality of pump(s) 37, which are connected to vacuum channels 18 through valve(s) 35A. In accordance with some embodiments, vacuum channels 18 include some portions forming or aligned to a plurality of concentric circles.

Further referring to FIG. 1, top wafer stage 22 is over bottom wafer stage 16. Vacuum channels 24 are formed in bottom wafer stage 16. The vacuum channels 24, with vacuum being generated therein, are used for sucking and fixing the underlying top wafer 12 onto top wafer stage 22. The vacuum may be generated by one or a plurality of pumps 37, which are connected to vacuum channels 18 through valve(s) 35B. The pumps 37 and valves 35A and 35B may be electrically connected to, and are controlled by, control unit 36. In accordance with some embodiments, vacuum channels 24 include some portions forming or aligned to a plurality of concentric circles.

As shown in FIGS. 1 and 2, at the center of top wafer stage 22, there is a hole, with center pin 26 penetrating through the hole. Center pin 26 is configured to be pushed down and lifted up. For example, FIG. 1 illustrates that center pin 26 pushes down the center of top wafer 12 to touch bottom wafer 14.

Wafer bonding module 10 includes a plurality of motors 34, which are mechanically coupled to, and are used to drive, top wafer stage 22. For example, motors 34 may be installed on top wafer stage 22 or installed on a fixed structure aside of top wafer stage 22. When the motors 34 are operated, motors 34 drive top wafer stage 22 up and down. Each of the plurality of motors 34 may be operated individually, regardless of the operation status of other motors 34, and may also be operated in a synchronous mode or an asynchronous mode. In accordance with some embodiments, there are three motors 34, while more motors may be used. For example, as shown in FIG. 2, there are three motors 34 uniformly distributed around top wafer stage 22. In accordance with some embodiments, motors 34 are piezo motors, which are capable of staging forward and backward and to drive top wafer stage 22 up-and-down for a very small distance, for example, in the order of nanometers. Motors 34 may be used to ensure that the bottom surface of top wafer stage 22 (and top wafer 12) is on a plane that is parallel to the plane of the top surface of bottom wafer stage 16 (and bottom wafer 14). Throughout the description, this is also referred to as that the top wafer stage 22 is parallel to the bottom wafer stage 16, and that top wafer 12 is parallel to the bottom wafer 14.

In accordance with some embodiments, the top wafer stage 22 is movable, and hence motors 34 are configured to move top wafer stage 22. In accordance with alternative embodiments, motors 34 may be attached to bottom wafer stage 16, and are configured to move bottom wafer stage 16 up and down. In accordance with these embodiments, top wafer stage 22 may be fixed in position. In accordance with yet alternative embodiments, both of top wafer stage 22 and bottom wafer stage 16 are movable, and may be used to adjust the stage gap and the wafer gap, as discussed in subsequently paragraphs.

Referring again to FIG. 1, a plurality of light channels 30 are formed inside top wafer stage 22. The light channels 30 may be hollow, or may be filled with a transparent material such as glass. Over each of light channel 30, optical devices 32 are located. Each of optical devices 32 includes a light-beam emitter, which is configured to emit a light beam downwardly, and a light sensor, which is configured to detect a reflected light beam. It is appreciated that although in the below discussion, a light-beam-emitting device and the corresponding light sensor are referred to as being inside a same optical device, they may be physically separate entities.

In accordance with some embodiments, optical devices 32 are configured to emit light beams 38 (which may be laser beams), which will be reflected by the top surface of wafer 12. Depending on whether the top surface of the underlying portion of top wafer 12 is vertical to light beam 38 or not, the reflected light beam 38 may be, or may not be, reflected back into the same light channel 30. Optical device 32 thus may receive, or may not receive, the reflected light beam. It may thus be determined whether the respective underlying portion of top wafer 12 is vertical to light beam 38 or not. The determination may be achieved by control unit 36 in accordance with some embodiments.

In accordance with some embodiments, as shown in FIG. 2, there is at least one row of optical devices 32 aligned to a same radius of wafer 12 and wafer 14. An example is shown in FIG. 2. There may also be a plurality of optical devices 32, which may be aligned to two or more radius of wafers 12 and 14. Each of the rows of optical devices 32 may have a total count ranging from 2 to 15 (or more), depending on the desirable accuracy of the bonding process control. For example, FIG. 2 illustrates that there are two rows of optical devices 32, each aligned to a radius. Alternatively stated, each of the rows of optical devices 32 are aligned to a straight line passing through the center 15 of wafers 12 and 14, and passing through the center of center pin 26. In accordance with some embodiments, the two or more rows of optical devices 32 are along different lattice planes of wafer 12 and wafer 14. For example, in the example as shown in FIG. 2, a first row of optical devices 32 may be aligned to a <100> plane of wafer 12 and/or wafer 14, and a second row of optical devices 32 may be aligned to a <111> planes of wafer 12 and/or wafer 14. Accordingly, the angle α between the two rows may be equal to 45 degrees in an example, while a different angle α such as 30 degrees, 60 degrees, 90 degrees, or the like may also be adopted. Since the bonding wave of wafers may have different propagation speed in different lattice directions, with two or more rows of optical devices that are not parallel to each other, the propagation speed of the bonding wave in different lattice directions may be monitored individually.

Further referring to FIGS. 1 and 2, there may be three (or more) stage sensors 28. Stage sensors 28 may be used to monitor the horizontal status of top wafer stage 22, and to monitor whether top wafer stage 22 is parallel to bottom wafer stage 16. For example, stage sensors 28 may monitor whether the distances between the stage sensors 28 and bottom wafer stage 16 are equal to each other or not. Stage sensors 28 may also be used to measure the distances between top wafer stage 22 and bottom wafer stage 16, as indicated as ΔS in FIG. 1. In accordance with some embodiments, stage sensors 28 are also used to determine the distance between bottom wafer 14 and top wafer 12. The vertical between the portion of bottom wafer 14 attached to bottom wafer stage 16 and the portion of top wafer 12 attached to top wafer stage 22 is referred to as wafer gap.

The wafer gap and stage gap ΔS are correlated. For example, the change in stage gap ΔS will result in the same amount of change in wafer gap ΔZ, and vice versa. The wafer gap may be calculated as (ΔS−T12−T14), wherein T12 is the thickness of wafer 12, and T14 is the thickness of wafer 14. Throughout the description, when the stage gap is referred to as being changed/adjusted, it also means the changing/adjustment of the wafer gap, and vice versa.

In accordance with some embodiments, each of stage sensors 28 is adjacent to one of motors 34), and may be placed as close to each other as possible. For example, each stage sensor 28 and its closest motor 34 may be on a same radius of wafers 12/14 (and on a same radius of top wafer stage 22 when top wafer stage 22 is round). For example, each stage sensor 28 and its closest motor 34 may be aligned to a straight line that passes through the center 15 of wafers 12 and 14. With this configuration, motors 34 may accurately adjust the distance of the corresponding stage sensor 28 from the underlying bottom wafer stage 16.

Wafer bonding module 10 further includes control unit 36. Control unit 36 may be used to electrically and/or signally coupled to the components in wafer bonding module 10, and coordinate the components. The function of control unit 36 is discussed in detail in subsequent paragraphs.

Figure 3:
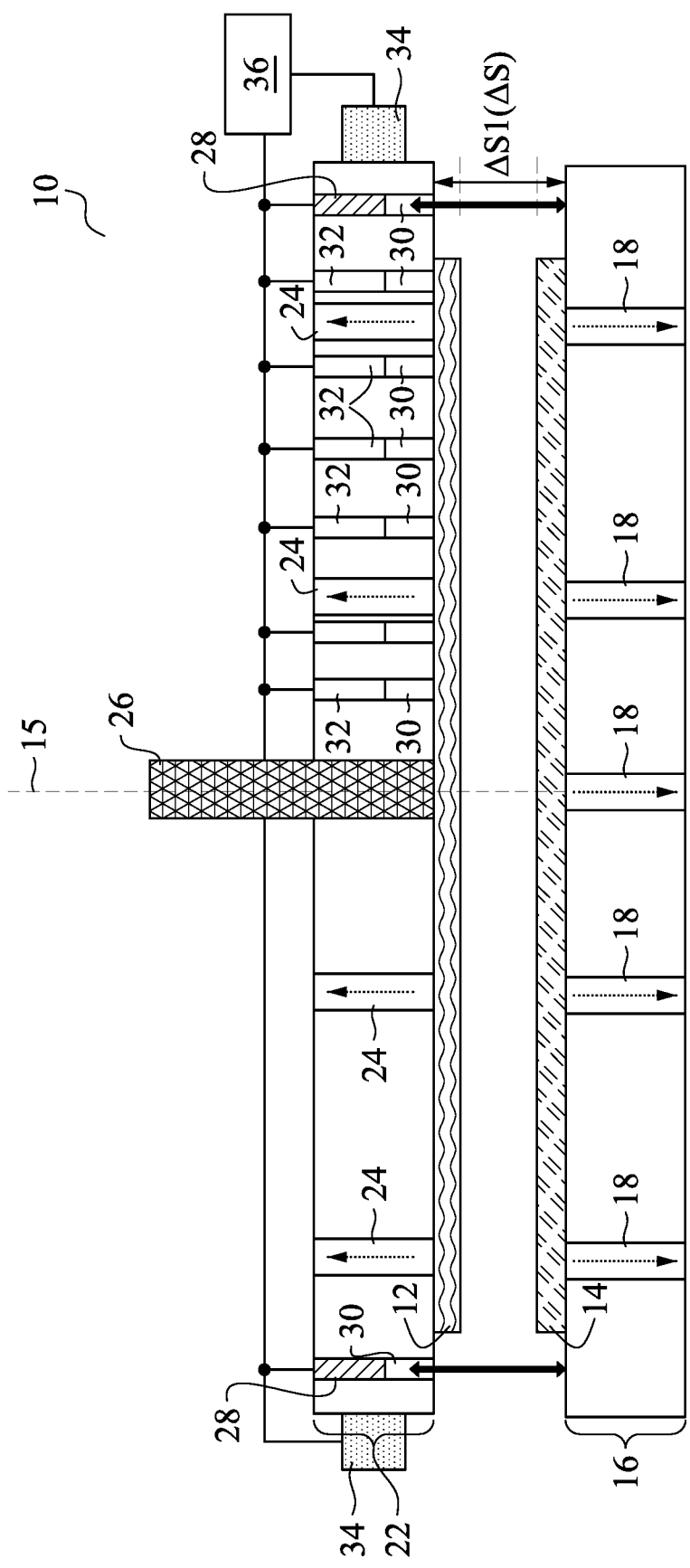
FIGS. 3-6 illustrate the cross-sectional views of intermediate stages in a bonding process adopting open-loop dynamic bond gap control in accordance with some embodiments.
Figure 13:
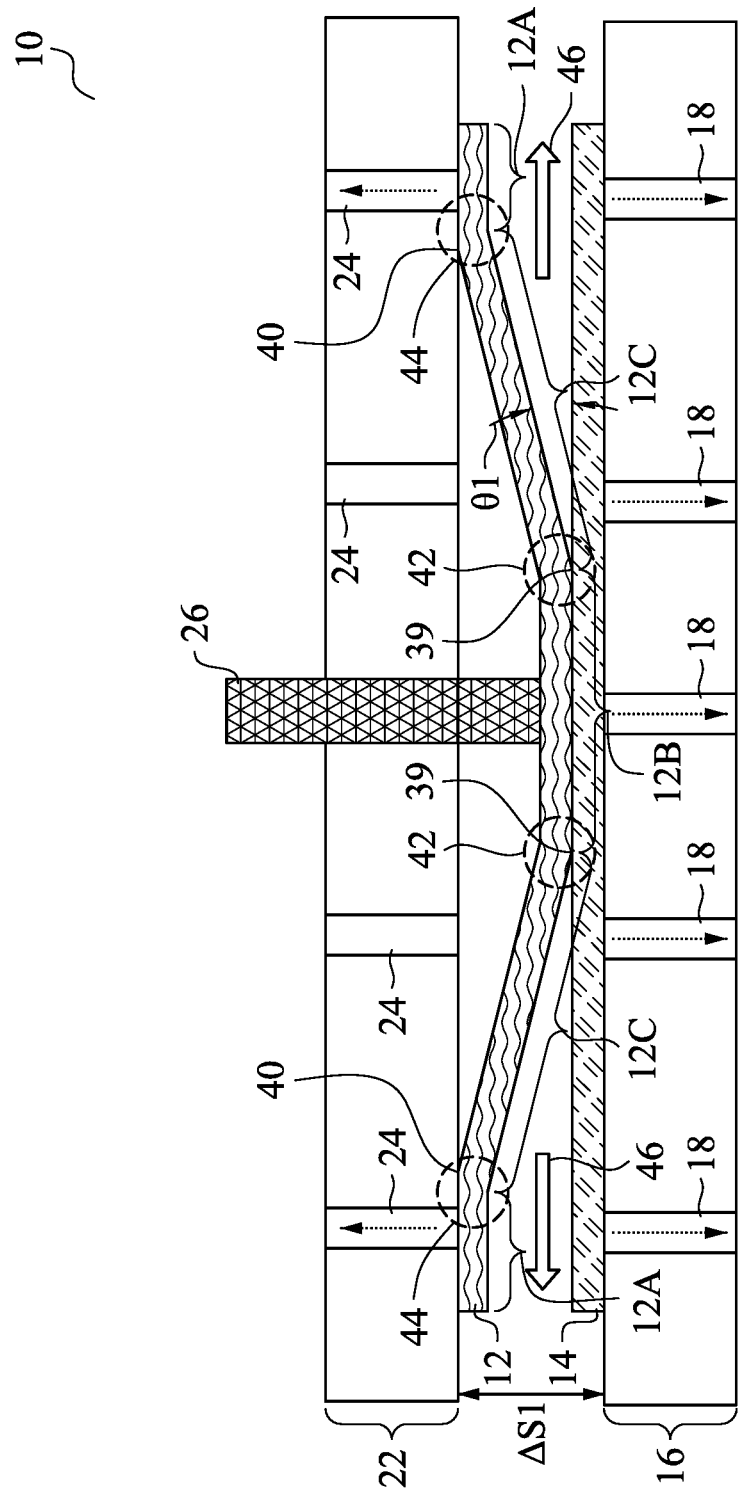
FIGS. 13 and 14 schematically illustrate the change in the slant angle of bent wafer portions in the bonding wave propagation when stage gap is unchanged during a pre-bonding process.
Figure 14:
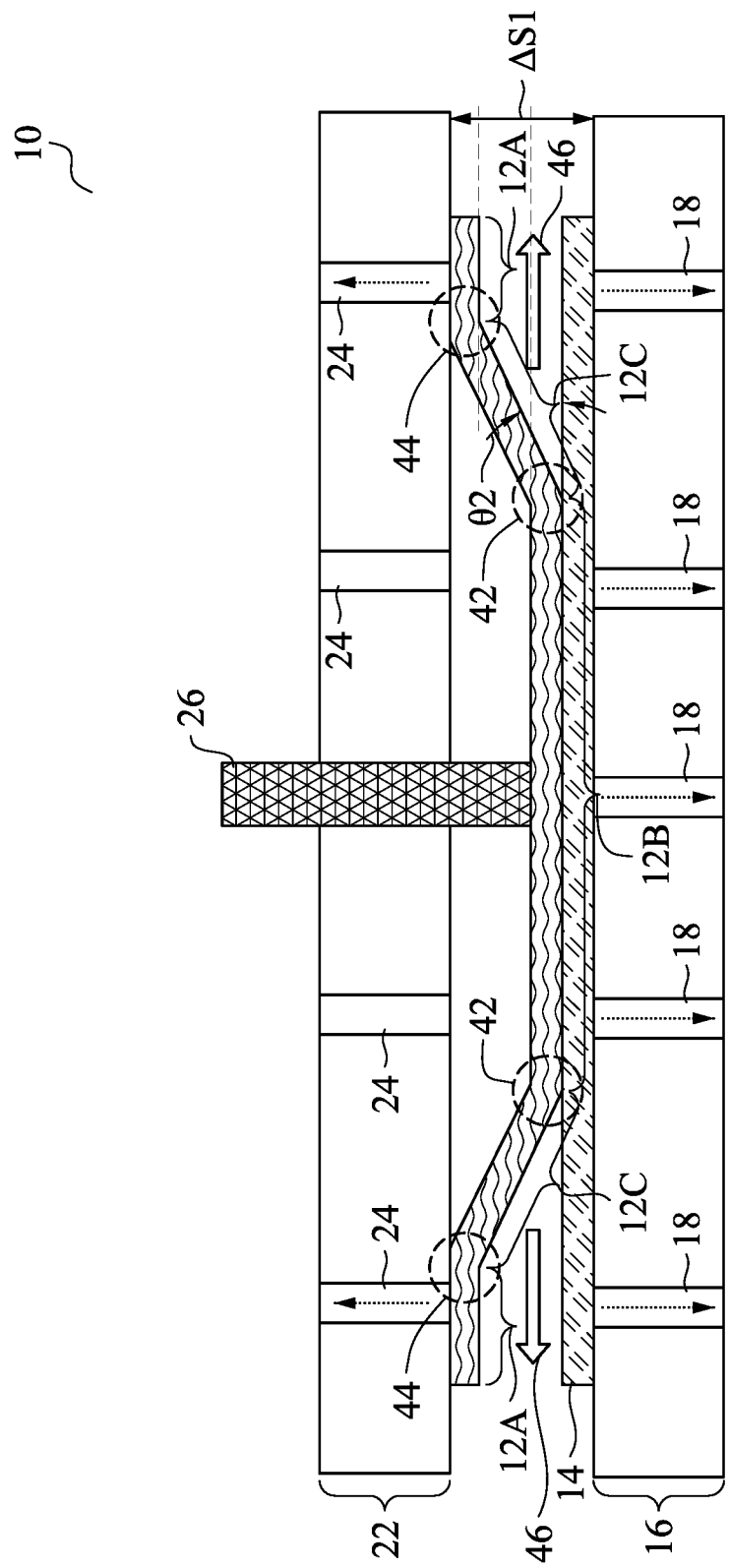

FIGS. 13 and 14 illustrate how a pre-bonding process proceeds when stage gap is unchanged during the pre-bonding process. In the initial stage, top wafer 12 is fixed on top wafer stage 22 due to the vacuuming through vacuum channels 24, and bottom wafer 14 is fixed onto bottom wafer stage 16 due to the vacuuming through vacuum channels 18. Both of top wafer 12 and bottom wafer 14 are planar, which is similar to what is shown in FIG. 3. Top wafer 12 and bottom wafer 14 are spaced apart from each other. Next, as shown in FIG. 13, center pin 26 is pushed down, which in turn pushes the center portion of top wafer 12 downwardly, so that the center portion 12B of top wafer 12 is pre-bonded to wafer 14. The edge portions 12A of top wafer 12, which form a ring, are fixed to top wafer stage 22. Portions 12C of top wafer 12, however, are slanted, and are neither attached to bottom wafer 14 nor top wafer stage 22. Portions 12C also form a ring when viewed from the top of top wafer 12. In subsequent description, portions 12C are referred to as slant portions, while portions 12A are referred to as top planar portions, and portions 12B are referred to as bottom planar portions.

As shown in FIG. 13, the outmost points where top wafer 12 contacts bottom wafer 14 are referred to as engaging points 39, which also forms a ring. After the top wafer 12 contacts bottom wafer 14, increasingly more portions of top wafer 12 are drawn down automatically to contact bottom wafer 14 over time, and increasingly more portions of wafers 12 and 14 are bonded together over time. Accordingly, engaging points 39 propagate from the initial positions toward the edges of wafers 12 and 14, which propagation generates a bonding wave traveling from the initial positions to the edges, as indicated by arrows 46. With the bonding wave propagating toward the edges of wafers 12 and 14, the air between wafers 12 and 14 may be squeezed out, so that no air bubble is trapped between package components wafers 12 and 14. The air bubble, if trapped, will cause the corresponding parts of wafers 12 and 14 unable to bond to each other, and will result in yield loss. The time interval for the bonding wave to travel from the initial positions to the edges (until full engagement of wafers 12 and 14 is achieved) is referred to as engaging time interval hereinafter. The engaging time interval may be in the range between about 4 seconds and about 20 seconds.

The innermost points wherein top wafer 12 contacts top wafer stage 22 are referred to as detaching points 40 hereinafter, wherein top wafer 12 starts to detach from top wafer stage 22 at the detaching points 40. In the circled portions 42 and 44, top wafer 12 are curved (bent). Between the curved portion 42 and its corresponding curved portion 44, top wafer 12 has a straight portion, which is a middle part of slant portion 12C. The straight portions form slant angle θ1 with a horizontal plane, which horizontal plane is parallel to the top surface of bottom wafer 14.

FIG. 14 illustrates the status of wafers 12 and 14 at a later time wherein bonding wave have propagated more toward the edges of wafers 12 and 14. In FIGS. 13 and 14, the gap ΔS1 between stages 16 and 22 remain to be the same as shown in FIG. 13. With the propagation of the bonding wave, the bottom planar portion 12B become increasingly larger, and the slant portions 12C become increasingly shorter. The slant angle of the slant portions 12C also become increasingly greater. As shown in FIG. 14, the slant angle has increased to slant angle θ2.

Figure 16:
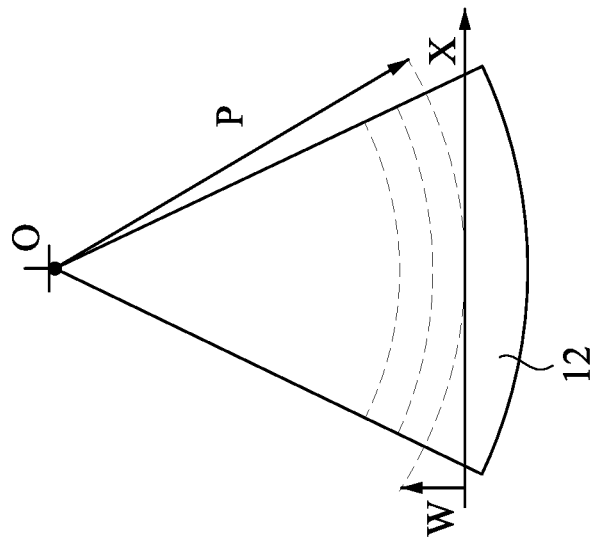
FIGS. 15 and 16 illustrate the radius of curvature in a curved/bent portion of a wafer in accordance with some embodiments.
Figure 15:
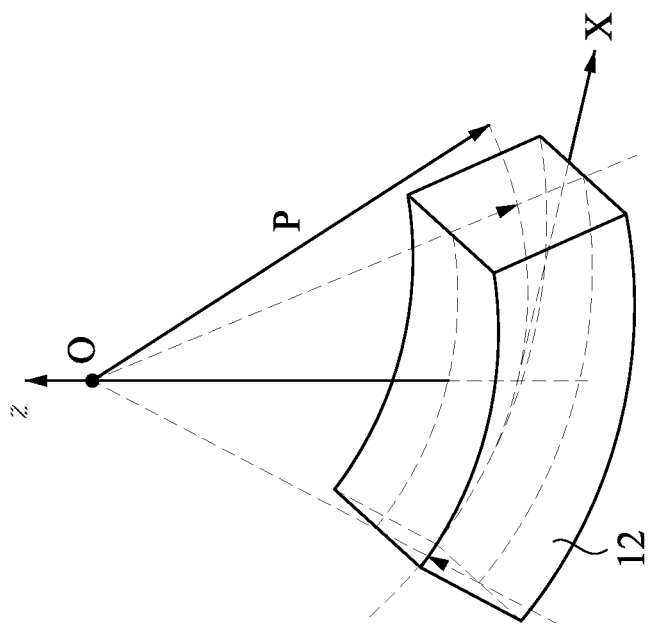

FIGS. 15 and 16 illustrate a perspective view and a cross-sectional view, respectively, of a curved portion of top wafer 12. Variable X represents the lateral distance in the direction parallel to the top surface of bottom wafer 14. Variable W represents the vertical distance in the direction perpendicular to the top surface of bottom wafer 14. Variable ρ represents the radius of curvature of the curved portion, and point O is the center of the curvature. Per Euler Bernoulli Beam Theory, the stress generated in the curved portion of wafer 12 is proportional to the second derivative ($d^2w/dx^2$) of variable W to variable X. The second derivative ($d^2w/dx^2$) is proportional to the 1/ρ. Accordingly, the stress is inversely proportional to the radius of curvature ρ. This means that the smaller the radius of curvature ρ is, the greater stress will be generated in the curved portion of top wafer 12.

Referring again to FIGS. 13 and 14, it has been found that with the proceeding of the bonding wave propagation, the slant angle increases continuously, and accordingly, the radius of curvature also increasingly and continuously reduce with the propagation of the bonding wave. This also means the stress of the curved portions of top wafer 12 increases with the propagation of the bonding wave. When wafers 12 and 14 are fully pre-bonded, there is a high stress residue in wafers 12 and 14. The stress residue may cause the deformation of wafers 12 and 14, and wafers 12 and 14 are less planar due to the stress. This incurs problems in subsequent processes including, and not limited to, photo lithography processes, planarization processes, etc.

To solve the above-discussed problems, dynamic bond gap control is performed during wafer bonding, as shown in the embodiments shown in FIGS. 3 through 6 and the embodiments shown in FIGS. 8 through 11. In the dynamic bond gap control, the stage gap ΔS (which are denoted as ΔS1, ΔS2, and ΔS3 as in FIGS. 3-6) between wafer stages 16 and 22 are dynamically adjusted and reduced during the propagation of the bonding wave, and the closer the bonding wave is to the edges of wafers 12 and 14, the smaller the gap ΔS is.

FIGS. 3 through 6 illustrate the cross-sectional views of intermediate stages in the bonding of wafers 12 and 14 through an open-loop dynamic bond gap control in accordance with some embodiments of the present disclosure. The corresponding processes are also reflected schematically in the process flow shown in FIG. 17. Referring to FIG. 3, bonding module 10 is provided. In the open-loop dynamic bond gap control, bonding module 10 may or may not include optical devices 32. When bonding module 10 includes optical devices 32, optical devices 32 may be or may not be used. When the optical devices 32 are used, data may be collected through optical devices 32. For example, the time required for the bonding wave to propagate from the initial engaging points to the edges of wafers 12 and 14 may be collected, and the propagating speed as a function of time is collected. The data collected by optical devices 32, however, are not used to feed back to the bonding process in real-time, and are not used to adjust the stage gap ΔS between wafer stages 16 and 22. Rather, the data may be used in the future to adjust the stage gap ΔS in future bonding processes.

Figure 17:
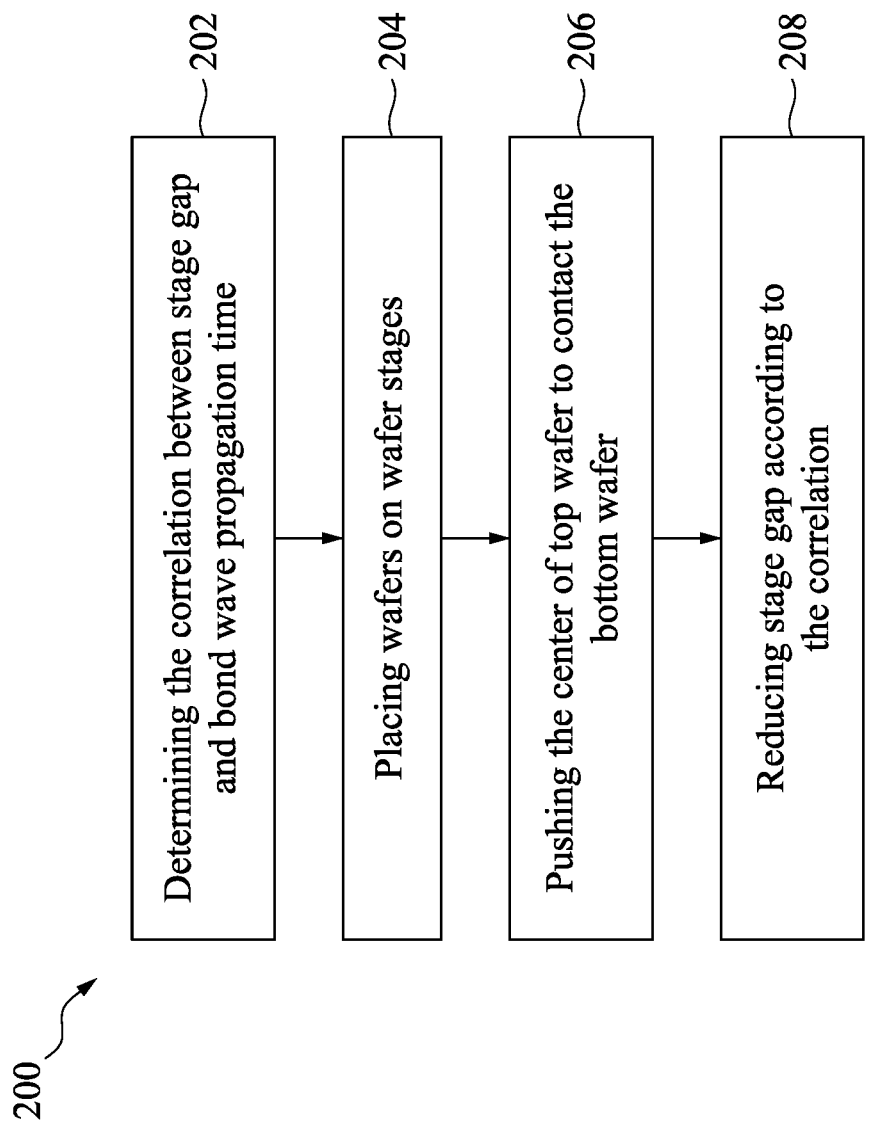
FIG. 17 illustrates a process flow in a bonding process adopting open-loop dynamic bond gap control in accordance with some embodiments.

FIG. 17 illustrates a process flow 200 of a bonding process using open-loop dynamic bond gap control. Since wafers with different surface conditions (such as the materials, whether and how the surfaces of the wavers are treated, etc.) may have different bonding wave propagation speed, sample wafers same as wafers 12 and 14 are studied first, and their bonding wave propagation speed is measured. Based on the measurement result, a correlation (which is also a schedule for adjusting stage gap over time) is established. The respective process is illustrated as process 202 in the process flow 200 as shown in FIG. 17. The correlation may specify at what time (starting from the initial engaging time), how big the stage gap should be adjusted to. The determination of the correlation is based on the intended result that when the bonding wave propagates, the slant angle θ (such as θ1 in FIG. 13 and θ2 in FIG. 14) should remain constant. For example, the slant angle θ may be controlled to have a variation smaller than about 20 percent or 10 percent of a predetermined (which is intended) slant angle). Alternatively, the slant angle θ may also reduce with time. The correlation may be a table, a function, or the like.

Referring again to FIG. 3, top wafer 12 is placed on (underlying) top wafer stage 22, and bottom wafer 14 is placed on bottom wafer stage 16. The respective process is illustrated as process 204 in the process flow 200 as shown in FIG. 17. The initial stage gap ΔS1 is selected based on the predetermined correlation, with motors 34 being operated to adjust to the desirable initial stage gap ΔS1.

Figure 4:
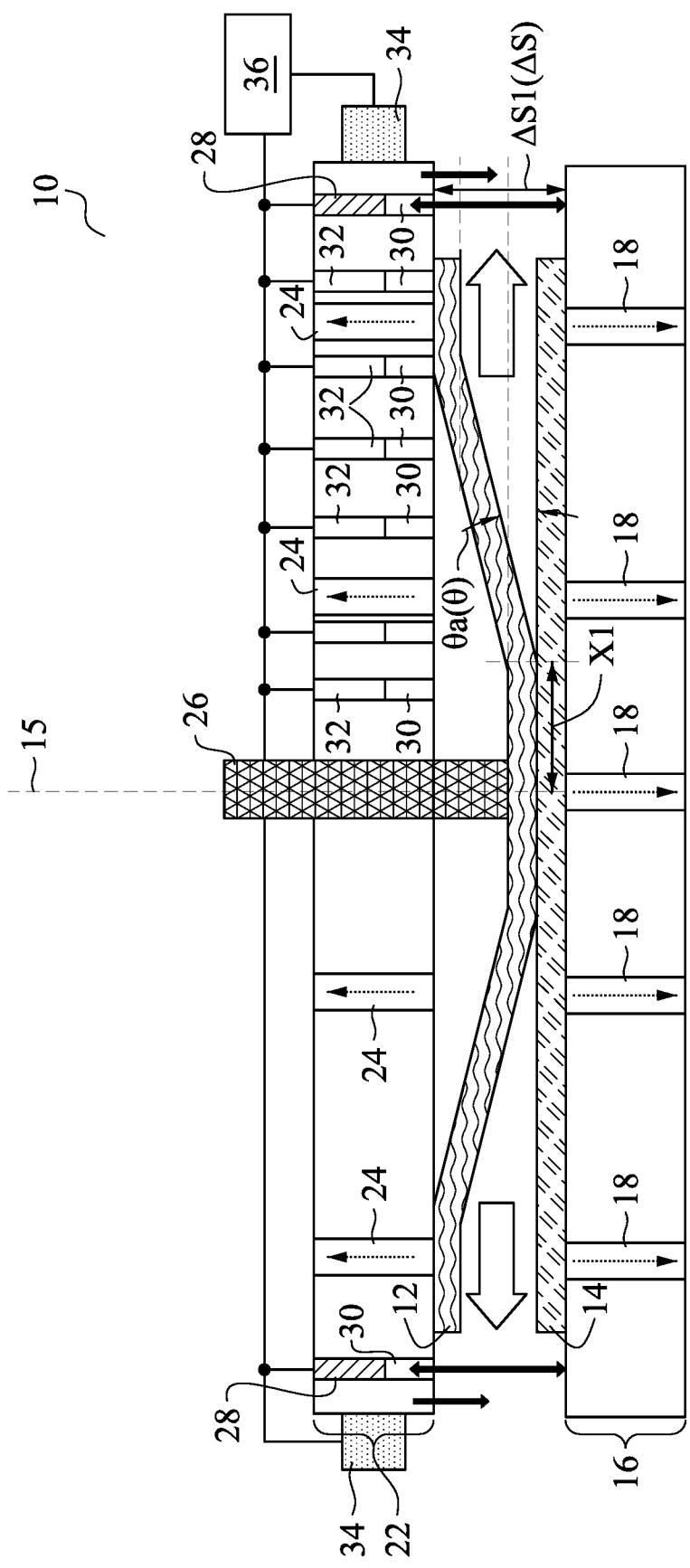
Figure 5:
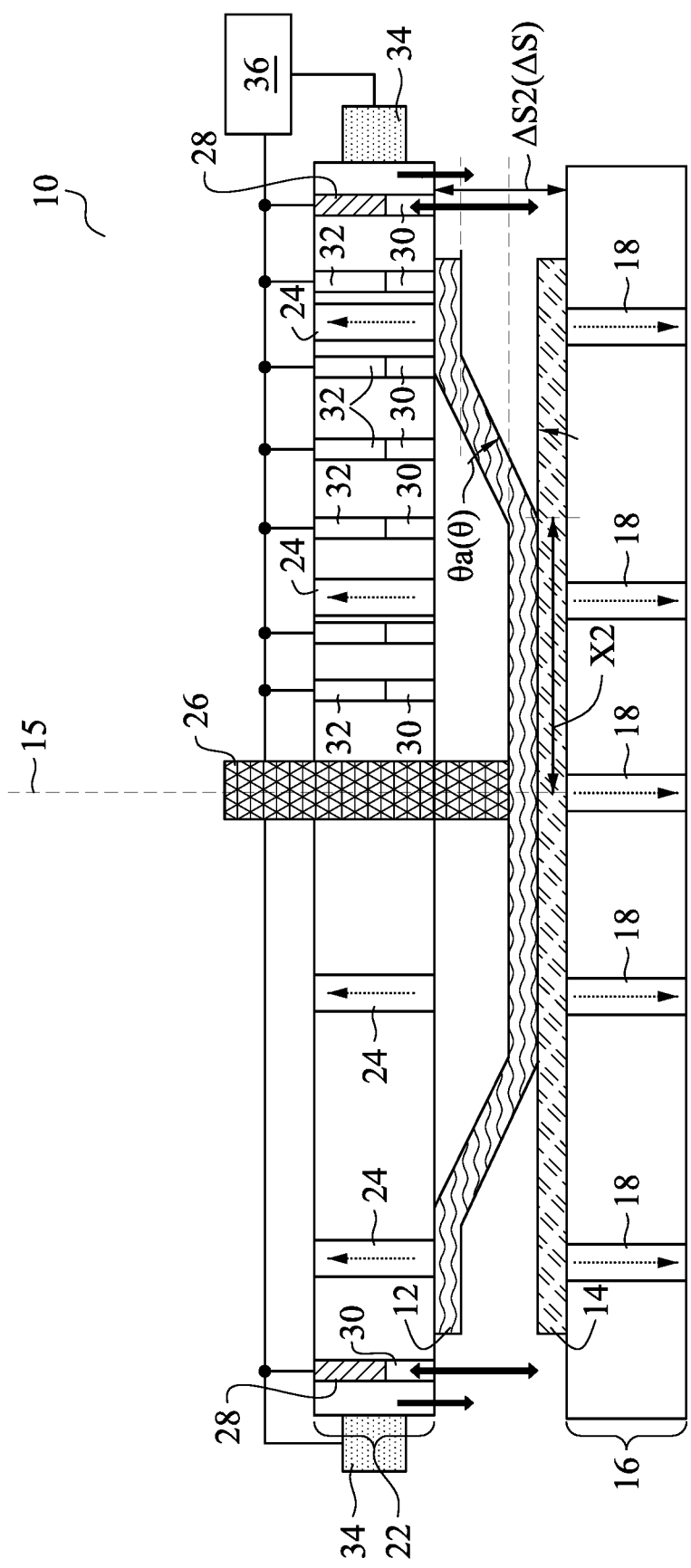

Next, referring to FIG. 4, center pin 26 is pushed down, and is used to push the center portion of top wafer 12 downwardly, so that the center portion of top wafer 12 contacts and pre-bonds to bottom wafer 14. The respective process is illustrated as process 206 in the process flow 200 as shown in FIG. 17. At this time, the wave-front position is X1. The wave-front position then increases automatically without the need of applying additional force. For example, as shown in FIG. 5, the wave-front position is increased to X2.

Figure 7:
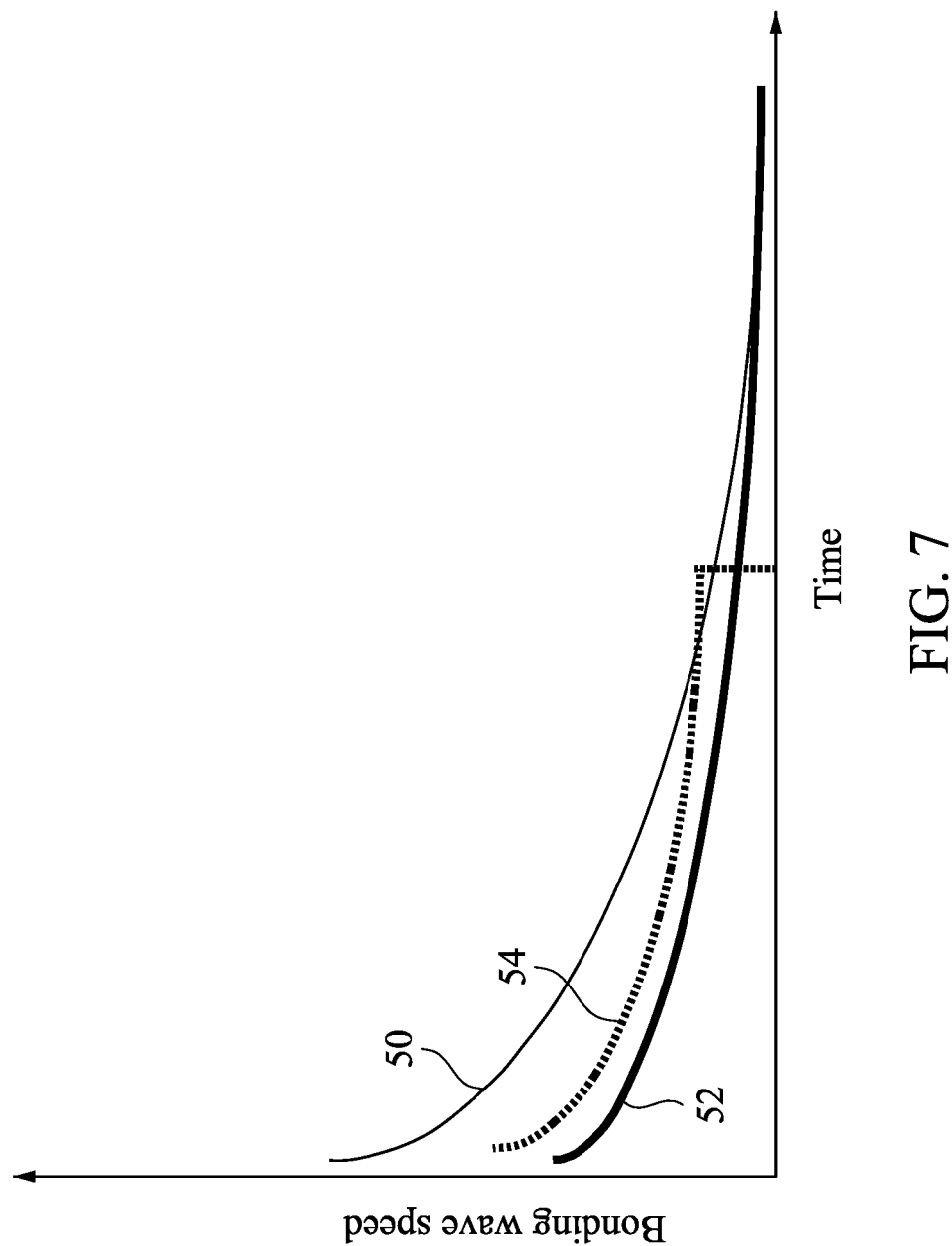
FIG. 7 illustrates some examples of the bonding wave propagation speed as a function of time.

FIG. 7 illustrates some examples of the bonding wave propagation speed as a function of time. Line 50 represents a relatively higher pre-bond energy curve, wherein wafers 12 and 14 (FIG. 5) are bonded with a higher strength, and hence the bonding wave is propagated faster. Line 52 represents a relatively lower pre-bond energy curve, wherein wafers 12 and 14 are bonded with a lower strength, and hence the bonding wave is propagated slower. Line 54 represents that top wafer stage 22 (FIG. 5) has a high vacuuming strength, and hence at the final stage of the bonding wave propagation, the edge portions of top wafer 12 are sucked tightly to top wafer stage 22, until at a time, the vacuum is released. As a result, top wafer 12 snaps to wafer 14 quickly.

The bonding wave propagation may be continuous. When the wave-front position starts to increase, the motors 34 are also operated to drive top wafer stage 22 downwardly, thus the stage gap is reduced. The respective process is illustrated as process 208 in the process flow 200 as shown in FIG. 17. For example, FIG. 5 shows that stage gap is reduced to ΔS2. The reduction of the stage gap may be started at the same time the center portion of top wafer 12 is pushed down and bonded to bottom wafer 14 (initial engagement), or at a time after the initial engagement. In accordance with some embodiments, the reduction of stage gap ΔS is continuous, and stage gap ΔS is continuously reduced during the entire period of time the bonding wave propagates. In accordance with alternative embodiments, the reduction of stage gap ΔS is periodic, and motors 34 are operated to reduce the stage gap by certain amount, and then motors 34 are stopped for a short period of time, and then are operated again. The operating and the stopping of motors 34 are repeated in a plurality of cycles in accordance with these embodiments.

As discussed referring to FIGS. 13 and 14, if stage gap ΔS is not reduced in the bonding wave propagation, the slant angle θ would have increased during the bonding wave propagation. In accordance with some embodiments as shown in FIGS. 3 through 6, with the reduction in stage gap ΔS, as shown in FIGS. 4 and 5, the slant angle θ remains to be a constant (θa) throughout the bonding wave propagation process. In accordance with alternative embodiments, with the reduction in stage gap ΔS, slant angle θ is reduced. In accordance with yet alternative embodiments, with the reduction in stage gap ΔS, slant angle θ is increased. The increase, however, is at a slower pace than if the stage gap is not reduced.

Figure 6:
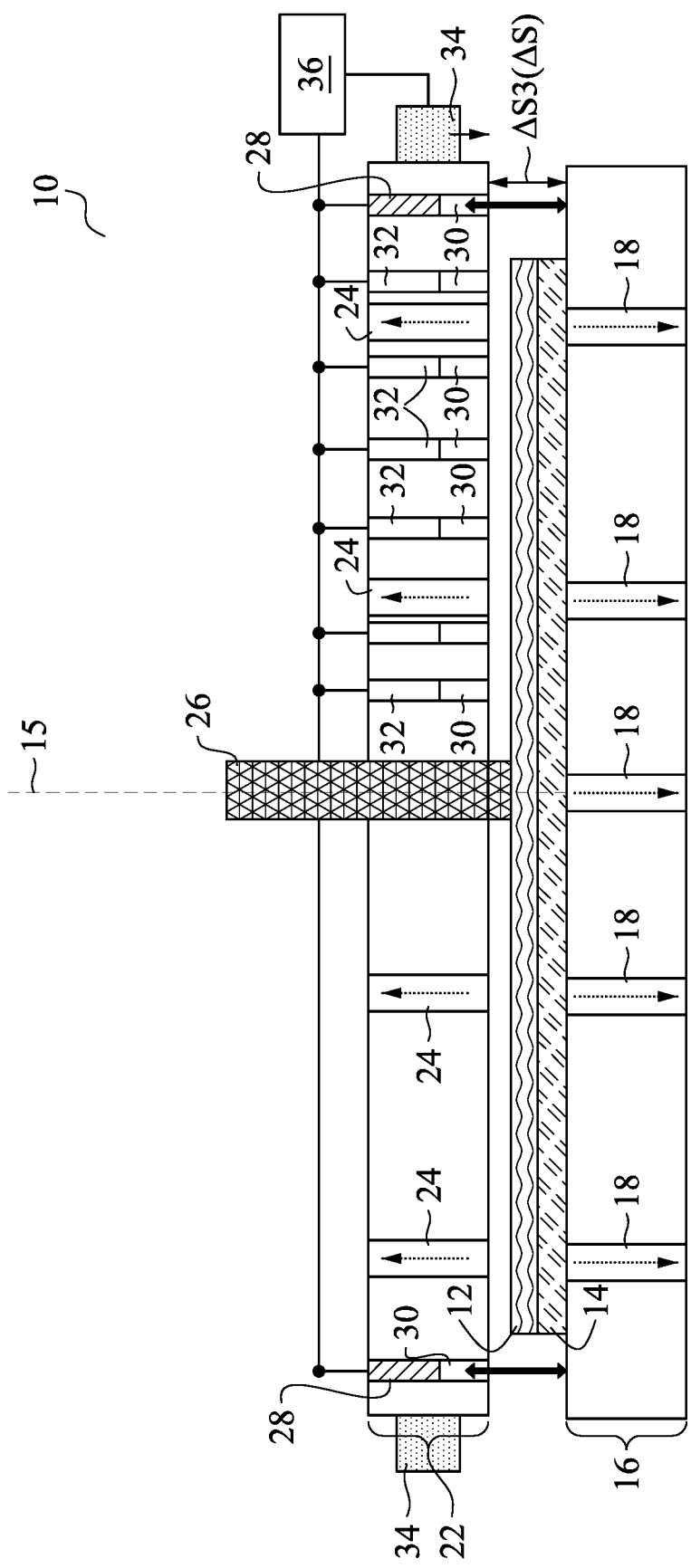

FIG. 6 illustrates the finishing of the pre-bonding process, wherein the bonding wave is propagated to the edges of wafers 12 and 14. At a time right before the last portion of top wafer 12 snaps to bottom wafer 14, the stage gap is ΔS3, which is a non-zero value smaller than ΔS2. At the end of the pre-bonding process, the stress in wafer 12 is lower due to the reduced slant angle θ. Accordingly, due to the reduced bending (and increased radius of curvature), the stress residue remaining in the bonded wafers 12 and 14 is low, and the problems caused by the stress residue to subsequent processes are reduced.

In accordance with some embodiments, after the pre-bonding process, an annealing process is performed at an elevated temperature, so that wafers 12 and 14 are fully bonded to each other. For example, the annealing process may be performed for a period of time in the range between about 2 hours and about 3 hours, and at a temperature in the range between about 200° C. and about 300° C.

Figure 18:
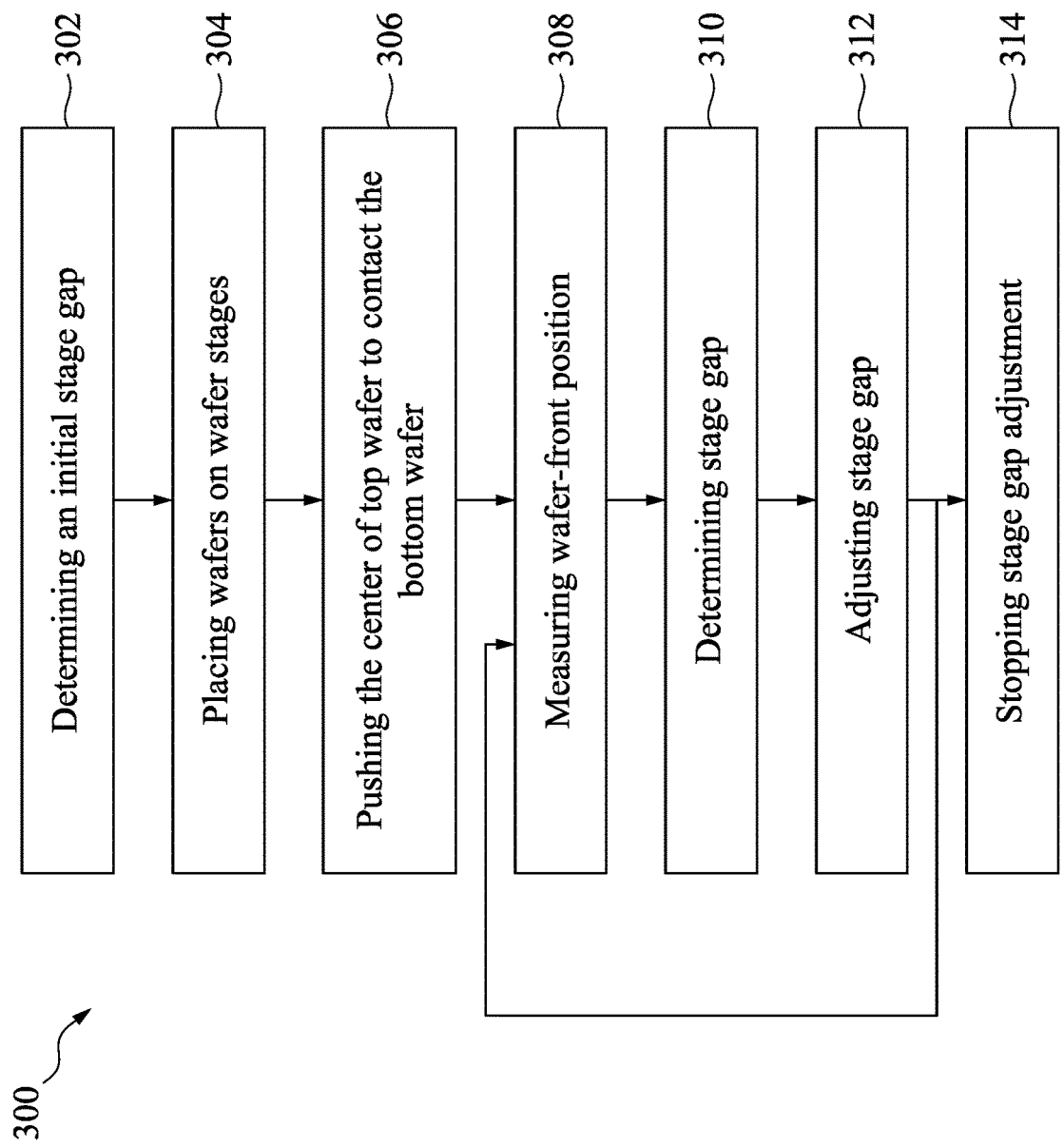
FIG. 18 illustrates a process flow in a bonding process adopting closed-loop dynamic bond gap control in accordance with some embodiments.

FIG. 18 illustrates a process flow 300 of a bonding process adopting closed-loop dynamic bond gap control. In the closed-loop dynamic bond gap control, instead of pre-determining the relationship between the stage gap and the bonding time, the wave-front position X is measured, and the stage gap ΔS is adjusted according to the measured wave-front position X in real-time.

Figure 8:
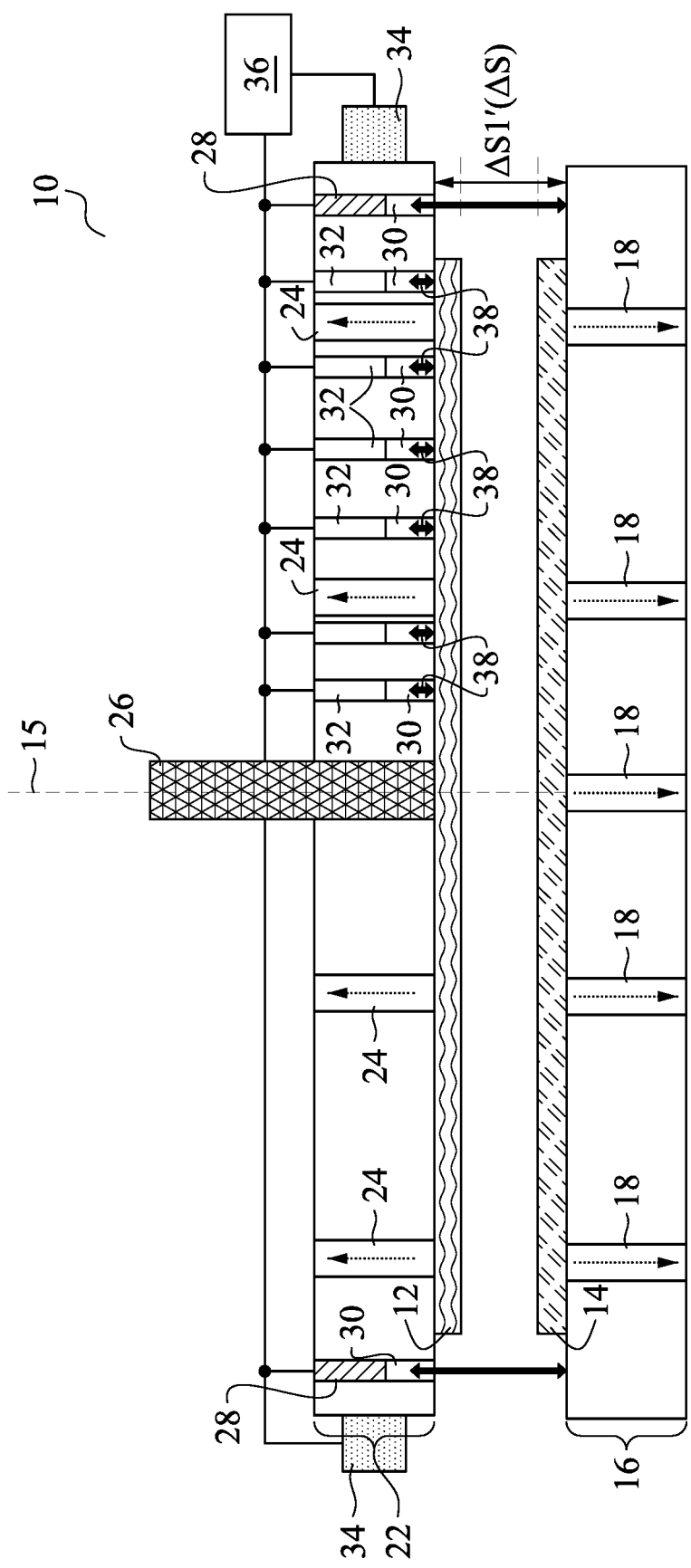
FIGS. 8-11 illustrate the cross-sectional views of intermediate stages in a bonding process adopting closed-loop dynamic bond gap control in accordance with some embodiments.

In accordance with some embodiments, an intended slant angle $θ_{int}$ is pre-determined as the target slant angle to achieve throughout the entire pre-bonding process. Accordingly, an initial stage gap is determined based on the intended slant angle $θ_{int}$. The respective process is illustrated as process 302 in the process flow 300 as shown in FIG. 18. Referring to FIG. 8, wafer 12 is placed on top wafer stage 22, and wafer 14 is placed on bottom wafer stage 16. The respective process is illustrated as process 304 in the process flow 300 as shown in FIG. 18. The initial stage gap ΔS1' is selected (by selecting the initial stage gap), so that the slant angle θ1' (FIG. 9) immediately after the initial engaging of wafer 12 and wafer 14 is close to the intended slant angle $\theta_{int}$. Motors 34 are operated to adjust the stage gap to the desirable stage gap $\Delta S1'$.

Figure 9:
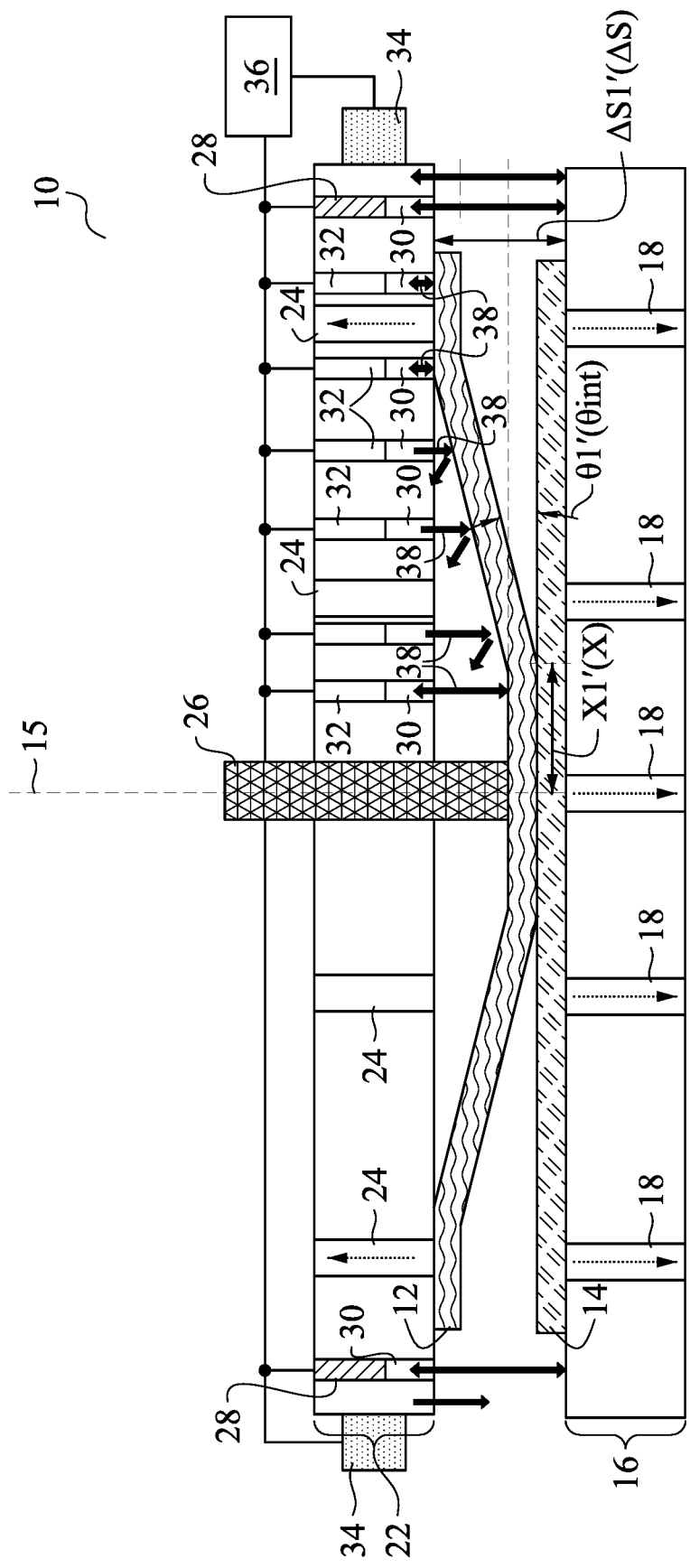

Next, referring to FIG. 9, center pin 26 is used to push the center portion of top wafer 12 down, so that the center portion of top wafer 12 contacts and pre-bonds to bottom wafer 14. The respective process is illustrated as process 306 in the process flow 300 as shown in FIG. 18. At this time, the wave-front position is X1'. The wave-front position X1' is measured using optical devices 32. The respective process is illustrated as process 308 in the process flow 300 as shown in FIG. 18. It is realized that when a portion of top wafer 12 is bent, the light beams 38 projected by the directly overlying optical device 32 is not able to be reflected upwardly into the corresponding optical devices 32. On the other hand, when a portion (such as the top planar portion and the bottom planar portion) of top wafer 12 is planar, the respective optical device 32 may receive the reflected light beam. For example, as shown in FIG. 9, the leftmost optical device and the rightmost two optical devices 32 may receive the reflected light beams, while the rest of optical devices 32 are not able to receive the reflected light beams. Accordingly, based on the positions of optical devices 32, the wave-front position X1' and the slant angle $\theta 1'$ are determined based on calculation. The calculation may be performed by control unit 36.

The calculated slant angle $\theta 1'$ is compared with intended slant angle $\theta_{int}$. The intended stage gap $\Delta S$ at this time is calculated (determined), which intended stage gap $\Delta S$ is able to be used to achieve the intended slant angle $\theta_{int}$. The respective process is illustrated as process 310 in the process flow 300 as shown in FIG. 18. The action of motors 34 is accordingly determined. For example, if the calculated slant angle $\theta 1'$ is greater than the intended slant angle $\theta_{int}$, motors 34 are operated to reduce the stage gap $\Delta S$ to stage gap $\Delta S2'$ (FIG. 10), so that that the slant angle $\theta 1'$ may be reduced. Alternatively, the staging of motors 34 may be accelerated if motors are already operating. The respective process is illustrated as process 312 in the process flow 300 as shown in FIG. 18. Otherwise, if the slant angle is excessively smaller than the intended slant angle $\theta_{int}$, motors 34 may be stopped to allow the slant angle to catch up.

Figure 10:
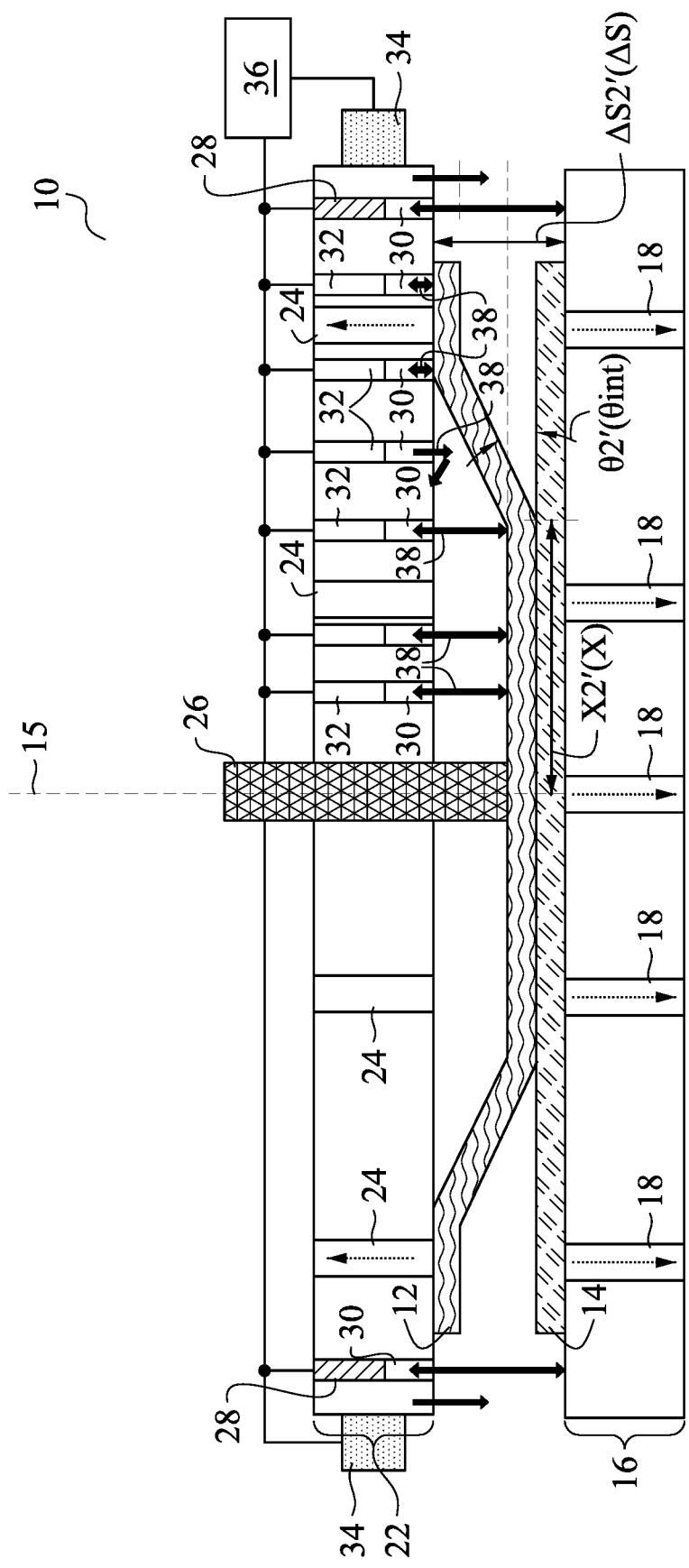

During the pre-bonding process, the wave-front position is increased automatically without the need of applying additional force. For example, as shown in FIG. 10, the wave-front position is increased to X2'.

Figure 11:
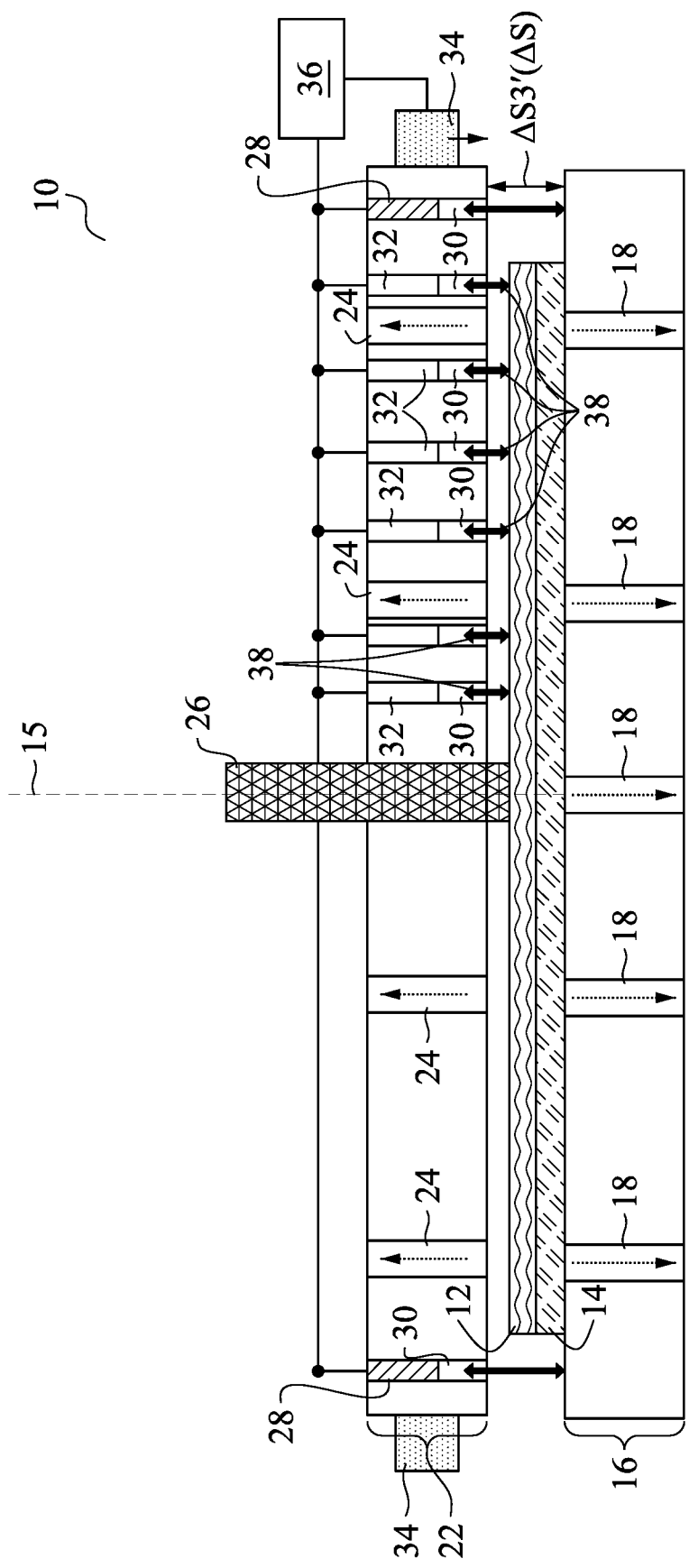

The processes 308, 310 and 312 are repeated in real-time as a plurality of cycles, so that with the propagation of the bonding wave, the stage gap $\Delta S$ is dynamically adjusted. The actual slant angle $\theta$ throughout the entire bonding wave propagation thus remains to be equal to or close to the intended slant angle $\theta_{int}$. For example, at any given time, the difference between the actual slant angle $\theta$ and the intended slant angle $\theta_{int}$ may be smaller than 20 percent or 10 percent of the intended slant angle $\theta_{int}$. As an example, as shown in FIG. 10, the slant angle is $\theta 2'$, which is also adjusted in real-time to be close to the intended slant angle $\theta_{int}$. The cycles may be repeated until all of optical devices 32 may receive the reflected light beam, indicating that wafers 12 and 14 are fully bonded, as indicated in FIG. 11. At a time right before the last portion of top wafer 12 snaps to bottom wafer 14, the stage gap is $\Delta S3'$, which is a non-zero value smaller than $\Delta S2'$. The pre-bonding process is thus finished. The cycles may also cause the stage gap to be reduced throughout the entire pre-bonding process or in stages (stopping and then operating again). At the end of the pre-bonding process, since the stress in wafer 12 is low due to reduced bending (and increased radius of curvature), the stress residue remaining in the bonded wafers 12 and 14 is low, and the problems caused by the stress residue to subsequent processes are reduced. In accordance with some embodiments, after the pre-bonding process, an annealing process is performed at an elevated temperature, so that wafers 12 and 14 are fully bonded to each other.

Figure 12:
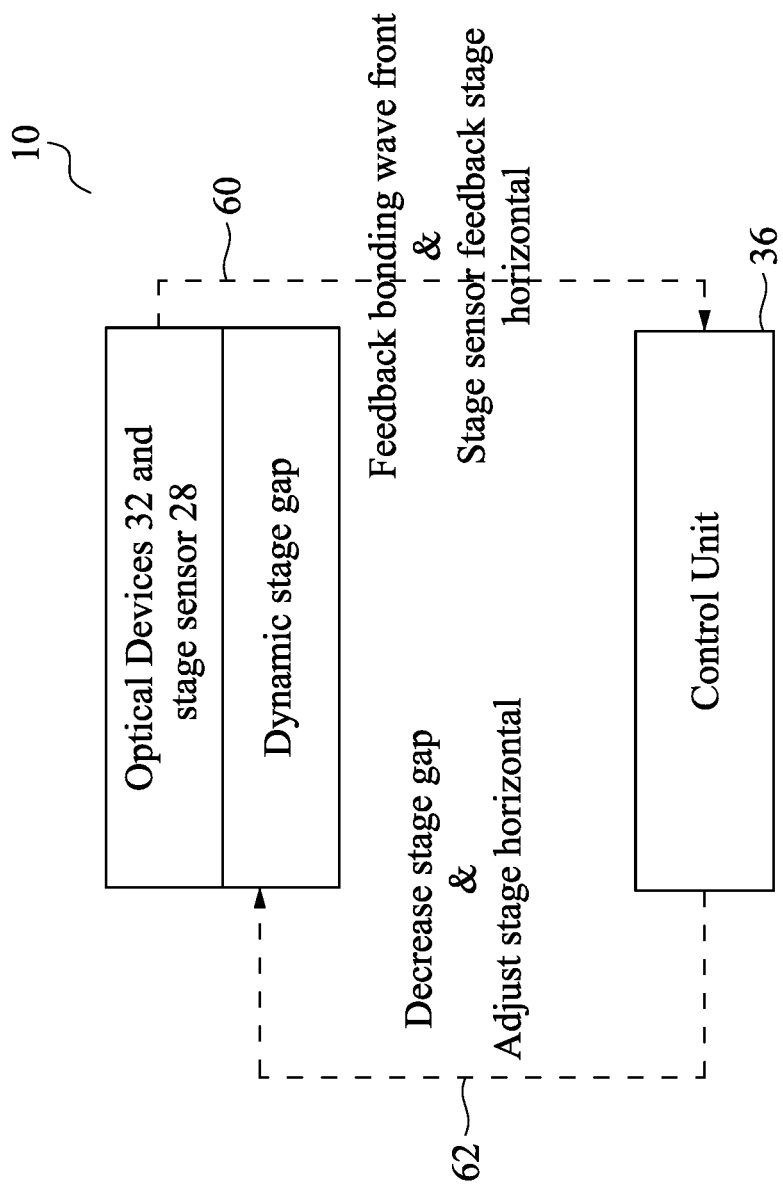
FIG. 12 schematically illustrates the components in a wafer-bonding module and the interactions between the components in accordance with some embodiments.

FIG. 12 illustrates the block diagrams of bond module 10 in accordance with some embodiments. As represented by arrow 60 in FIG. 12, control unit 36 dynamically monitors the stage gap, so that the stage gap is a dynamic stage gap. The optical devices 32 (FIG. 1) interact with the control unit 36 to provide the wave-front positions and the positions of the slant portions of top wafer 12, so that control unit 36 is able to operate motors 34 and decrease bonding gap 9 (arrow 62). Also, the stage sensors in optical devices 28 (FIGS. 1 and 2) provide the data to control unit 36 so that it may determine whether the top wafer stage 22 is parallel to the bottom wafer stage 16, and control unit 36 is able to receive the data and operate motors 34 to ensure wafer stages 16 and 22 are parallel to each other, and wafers 12 and 14 are parallel to each other.

Referring back to FIGS. 1 and 2, control unit 36 integrates the components in bonding module 10 as an integrated system. For example, control unit 36 is configured to receive the electrical signals (and optical signals, if needed) of all of the components as shown in FIGS. 1 and 2, and controls the operation of the components such as motors 34, stage sensors 28, optical devices 32, center pin 26, pumps 37, and valves 35A and 35B. Control unit 36 may also control the movement of center pin 26, so that it pushes down the center portion of top wafer 12 to initiate bonding wave. When the bonding wave propagates from the center of wafers 12 and 14 to the edges, control unit 36 operates optical devices 32 to determine where the bonding wave has moved to, calculates the slant angle $\theta$, and provide signals to motors 34 to move at the desirable speed, so that the slant angle $\theta$ may be controlled in a desirable way (such as being constant). Control unit 36 may also release the vacuum of the outmost ring of vacuum channels 24 when the bonding wave has moved to the outmost ring of vacuum channels 24. Also, control unit 36 may be signally connected to stage sensors 28 to determine the distance between wafers 12 and 14, and adjust the operation of motors 34, so that the distance (and accordingly slant angle $\theta$) is controlled. When control unit 36 detects that top wafer stage 22 is not parallel to bottom wafer stage 16 (through the detection using stage sensors 28), control unit 36 may also operate the corresponding motors 34 to make wafers 12 and 14 parallel to each other.

The embodiments of the present disclosure have some advantageous features. By dynamically reducing stage gap during pre-bonding process, the slant angle of the bent portions of the top wafer is reduced, and the radius of curvature is increased. The stress residual in the bonded wafer is thus reduced.

In accordance with some embodiments of the present disclosure, a method includes placing a first wafer on a first wafer stage; placing a second wafer on a second wafer stage in opposition to the first wafer stage; pushing a center portion of the first wafer to contact the second wafer, wherein a bonding wave propagates from the center portion to edge portions of the first wafer and the second wafer; and when the bonding wave propagates from the center portion to the edge portions of the first wafer and the second wafer, reducing a stage gap between the first wafer stage and the second wafer stage. In an embodiment, when the bonding wave propagates, the first wafer comprises a bent portion that is bent, and the bent portion also propagates toward the edge portions of the first wafer and the second wafer, and wherein when the bonding wave propagates, a slant angle of the bent portion is either unchanged or reduced. In an embodiment, when the bonding wave propagates, the slant angle of the bent portion is a substantially constant angle. In an embodiment, when the bonding wave propagates, the slant angle of the bent portion reduces with time. In an embodiment, when the bonding wave propagates, the slant angle of the bent portion increases. In an embodiment, the reducing the stage gap is performed through a pre-determined schedule, in which a reduction rate of the stage gap is a function of time. In an embodiment, the method further comprises measuring positions of a bonding wave front of the first wafer and the second wafer, and the reducing the stage gap is based on the measured positions. In an embodiment, the method further comprises emitting a plurality of light beams on the first wafer, wherein the plurality of light beams are aligned to a radius of the first wafer; and detecting the plurality of light beams reflected from the first wafer, wherein the positions of the bonding wave front is determined based on the light beams reflected from the first wafer. In an embodiment, the reducing the stage gap between the first wafer and the second wafer is performed through a plurality of motors to drive the first wafer stage. In an embodiment, the method further comprises detecting whether the first wafer stage and the second wafer stage are parallel to each other through a plurality of stage sensors; and driving the first wafer stage to make the first wafer stage and the second wafer stage to be parallel to each other.

In accordance with some embodiments of the present disclosure, a method comprises placing a bottom wafer on a bottom wafer stage; placing a top wafer on a top wafer stage; and allowing a bonding wave to propagate from the center portion to edge portions of the top wafer and the bottom wafer, wherein when the bonding wave propagates, a bent portion of the top wafer at a bonding-wave front also propagates toward the edge portions of the top wafer and the bottom wafer, and when the bent portion propagates, a slant angle of the bent portion is either constant or reduced. In an embodiment, the slant angle is kept as substantially a constant when the bent portion propagates. In an embodiment, the slant angle is reduced when the bent portion propagates. In an embodiment, the center portion of the top wafer contacts the bottom wafer at a first time point, and at the first time point, the top wafer and the bottom wafer have a first stage gap, and at a second time point later than the first time point, wherein the bonding wave still propagates at the second time point, the top wafer and the bottom wafer have a second stage gap smaller than the first stage gap.

In accordance with some embodiments of the present disclosure, an apparatus comprises a bottom wafer stage; a top wafer stage overlapping the bottom wafer stage; a plurality of motors configured to drive the top wafer stage; a plurality of vacuum pumps; and a control unit electrically coupled to the plurality of motors and the plurality of vacuum pumps, wherein the control unit is configured to operate the plurality of motors and to drive the top wafer stage toward the bottom wafer stage when the plurality of vacuum pumps are operated. In an embodiment, the apparatus further comprises a first plurality of light beam emitters allocated aligning to a first straight line that extends from a center of the top wafer stage toward an edge of the top wafer stage; and a first plurality of light sensors allocated aligning to the first straight line. In an embodiment, the control unit is configured to receive signals from the first plurality of light sensors, and operate the plurality of motors based on the signals from the first plurality of light sensors. In an embodiment, the apparatus further comprises a second plurality of light beam emitters allocated aligning to a second straight line that extends from the center of the top wafer stage toward the edge of the top wafer stage; and a second plurality of light sensors allocated aligning to the second straight line. In an embodiment, the first straight line and the second straight line form a 45-degree angle. In an embodiment, the apparatus further comprises a plurality of stage sensors configured to detect a status reflecting whether the top wafer stage is parallel to the bottom wafer stage, and wherein the control unit is configured to drive the plurality of motors based on the status.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   placing a first wafer on a first wafer stage;
   placing a second wafer on a second wafer stage in opposition to the first wafer stage;
   pushing a center portion of the first wafer to contact the second wafer, wherein a bonding wave propagates from the center portion to edge portions of the first wafer and the second wafer; and
   when the bonding wave propagates from the center portion to the edge portions of the first wafer and the second wafer, reducing a stage gap between the first wafer stage and the second wafer stage.

2. The method of claim 1, wherein when the bonding wave propagates, the first wafer comprises a bent portion that is bent with a slant angle being formed, and the bent portion also propagates toward the edge portions of the first wafer and the second wafer.

3. The method of claim 2, wherein when the bonding wave propagates, the slant angle of the bent portion is a substantially constant angle.

4. The method of claim 2, wherein when the bonding wave propagates, the slant angle of the bent portion reduces with time.

5. The method of claim 2, wherein when the bonding wave propagates, the slant angle of the bent portion increases.

6. The method of claim 1, wherein the reducing the stage gap is performed through a pre-determined schedule, in which a reduction rate of the stage gap is a function of time.

7. The method of claim 1 further comprising measuring positions of a bonding wave front of the first wafer and the second wafer, and the reducing the stage gap is based on the measured positions.

8. The method of claim 7 further comprising:
   emitting a plurality of light beams on the first wafer, wherein the plurality of light beams are aligned to a radius of the first wafer; and detecting the plurality of light beams reflected from the first wafer, wherein the positions of the bonding wave front is determined based on the light beams reflected from the first wafer.

9. The method of claim 1, wherein the reducing the stage gap between the first wafer and the second wafer is performed through a plurality of motors to drive the first wafer stage.

10. The method of claim 1 further comprising:
detecting whether the first wafer stage and the second wafer stage are parallel to each other through a plurality of stage sensors; and
driving the first wafer stage to make the first wafer stage and the second wafer stage to be parallel to each other.

11. A method comprising:
placing a bottom wafer on a bottom wafer stage;
placing a top wafer on a top wafer stage; and
allowing a bonding wave to propagate from a center portion to edge portions of the top wafer and the bottom wafer, wherein when the bonding wave propagates, a bent portion of the top wafer at a bonding-wave front also propagates toward the edge portions of the top wafer and the bottom wafer, and when the bent portion propagates, a slant angle of the bent portion is either constant or reduced.

12. The method of claim 11, wherein the slant angle is kept as substantially a constant when the bent portion propagates.

13. The method of claim 11, wherein the slant angle is reduced when the bent portion propagates.

14. The method of claim 11, wherein the center portion of the top wafer contacts the bottom wafer at a first time point, and at the first time point, the top wafer and the bottom wafer have a first stage gap, and at a second time point later than the first time point, wherein the bonding wave still propagates at the second time point, the top wafer and the bottom wafer have a second stage gap smaller than the first stage gap.

15. A method comprising:
placing a first wafer on a first wafer stage;
placing a second wafer over and spaced apart from the first wafer;
contacting a first center portion of the first wafer with a second center portion of the second wafer, wherein a bonding wave propagates from the first center portion and the second center portion to edge portions of the first wafer and the second wafer; and
when the bonding wave propagates, reducing a distance between a first wafer edge of the first wafer and a second wafer edge of the second wafer, wherein the second wafer edge is directly over the first wafer edge.

16. The method of claim 15, wherein the second wafer is placed under and attached to a second wafer stage, and wherein when the bonding wave propagates, a distance from the second wafer stage to the first wafer stage is gradually reduced.

17. The method of claim 15, wherein when the bonding wave propagates, the second wafer comprises a bent portion that is bent with a slant angle being formed, and the bent portion also propagates toward the edge portions of the first wafer and the second wafer.

18. The method of claim 17, wherein when the bonding wave propagates, the slant angle of the bent portion is a substantially constant angle or reduces with time.

19. The method of claim 15 further comprising:
when the bonding wave propagates, measuring the distance; and
adjusting a position of the second wafer in response to the distance.

20. The method of claim 15 further comprising, after the bonding wave reaches the edge portions of the first wafer and the second wafer, annealing to bond the first wafer to the second wafer.

* * * * *